United States Patent
Morad et al.

(10) Patent No.: US 6,897,146 B2
(45) Date of Patent: May 24, 2005

(54) SYSTEM ARCHITECTURE OF SEMICONDUCTOR MANUFACTURING EQUIPMENT

(75) Inventors: Ratson Morad, Palo Alto, CA (US); Ho Seon Shin, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/602,225

(22) Filed: Jun. 23, 2003

(65) Prior Publication Data

US 2004/0087154 A1 May 6, 2004

Related U.S. Application Data

(62) Division of application No. 09/680,984, filed on Oct. 5, 2000, now Pat. No. 6,599,368.

(51) Int. Cl.[7] ......................................... H01L 21/4763
(52) U.S. Cl. ...................................... 438/643; 438/758
(58) Field of Search ................................. 438/643, 758; 118/503, 707

(56) References Cited

U.S. PATENT DOCUMENTS 5,996,353 A * 12/1999 Maxwell et al. .............. 62/3.2
6,136,725 A * 10/2000 Loan et al. .................. 438/758
6,413,858 B1 * 7/2002 Chopra ....................... 438/643

* cited by examiner

Primary Examiner—Evan Pert
Assistant Examiner—Asok Kumar Sarkar
(74) Attorney, Agent, or Firm—Robert J. Stern

(57) ABSTRACT

A semiconductor manufacturing equipment wherein degas chamber(s) are integrated to the conventional pass-through chamber location. A preferred embodiment for depositing Cu barrier and seed layers on a semiconductor wafer comprises a front opening unified pod(s), a single wafer loadlock chamber(s), a degas chamber(s), a preclean chamber(s), a Ta or TaN process chamber(s), and a Cu process chamber(s). The degas chamber is integrated to a pass-through chamber. Such system may achieve system throughput higher than 100 wafers per hour.

16 Claims, 2 Drawing Sheets

SYSTEM ARCHITECTURE OF SEMICONDUCTOR MANUFACTURING EQUIPMENT

This patent application is a divisional of application Ser. No. 09/680,984 filed Oct. 05, 2000 now U.S. Pat No. 6,599,368.

BACKGROUND OF THE INVENTION

1. Field of the Invention

The present invention relates generally to the field of semiconductor manufacturing. More specifically, the present invention relates to system architecture of semiconductor manufacturing equipment for ultra high system throughput with reduced cost.

2. Description of the Related Art

Semiconductor substrates (wafers) typically have many layers deposited thereon for device fabrication. Depositing many layers of various films is typically performed using deposition systems with multiple chambers designed for various processes. One of the most important performance indexes of the semiconductor manufacturing system is the system throughput, which is typically described as number of wafers per hour (wph). A single bottleneck point typically limits the system throughput, and this bottleneck can be a process chamber or a cluster robot (either a buffer robot or a transfer robot). If the chamber process times are short enough, the theoretical limit of maximum system throughput of such process sequencing is mainly by robot swap speed and the number of swaps each robot needs to complete full sequencing.

Conventionally, the system architectures for depositing Cu barrier and seed layers on semiconductor wafers have 3 or 4 wafers swaps for buffer robot and 3 swaps for transfer robot. For the configuration having 3 swaps each for buffer robot and transfer robot, the robot-limited system throughput is much higher than the one with 4 swaps for buffer robot. However, problems occur when maximum allowed chamber time become too short to complete the process required.

Therefore, the prior art is deficient in the lack of a n effective system or means for depositing Cu barrier and seed layers on semiconductor wafers with ultra high system throughput while the chamber time is sufficient for performing the processes. The present invention fulfills this long-standing need and desire in the art.

SUMMARY OF THE INVENTION

In one aspect of the present invention, there is provided a system architecture of semiconductor manufacturing equipment, wherein degas chamber(s) are integrated to the conventional pass-through chamber location.

In another aspect of the present invention, there is provided a system for depositing Cu barrier and seed layers on a semiconductor wafer. This system comprises a front opening unified pod(s), a single wafer loadlock chamber(s), a degas chamber(s), a preclean chamber(s), a Ta or TaN process chamber(s), and a Cu process chamber(s). The degas chamber is integrated to a pass-through chamber location.

In still another aspect of the present invention, there is provided a method of depositing Cu barrier and seed layers on a semiconductor wafer using the above-described system. This method comprises the steps of (1) loading the wafer to the degas chamber from the front opening unified pod through the single wafer loadlock chamber; (2) performing degas processing on the wafer in the degas chamber; (3) removing native oxide from the wafer surface in the preclean chamber; (4) depositing Ta or TaN on the wafer in the Ta or TaN process chamber; (5) passing the processed wafer through the degas chamber; (6) depositing Cu seed layer on the wafer in the Cu process chamber; and (7) transferring the processed wafer from the Cu process chamber to the front opening unified pod through the single wafer loadlock chamber, thereby obtaining a wafer with Cu barrier and seed layer deposition.

Other and further aspects, features, and advantages of the present invention will be apparent from the following description of the embodiments of the invention given for the purpose of disclosure.

BRIEF DESCRIPTION OF THE DRAWINGS

So that the matter in which the above-recited features, advantages and object of the invention, as well as others which will become clear, are attained and can be understood in detail, more particular descriptions of the invention briefly summarized above are provided by reference to certain embodiments thereof which are illustrated in the appended drawings. These drawings form a part of the specification. It is to be noted, however, that the appended drawings illustrate embodiments of the invention and therefore are not to be considered limiting in their scope.

DETAILED DESCRIPTION OF THE INVENTION

Provided herein is a novel system architecture with a unique degas chamber location to substantially improve the system throughput and reduce cost of the conventional design of semiconductor manufacturing system.

Figure 1B:
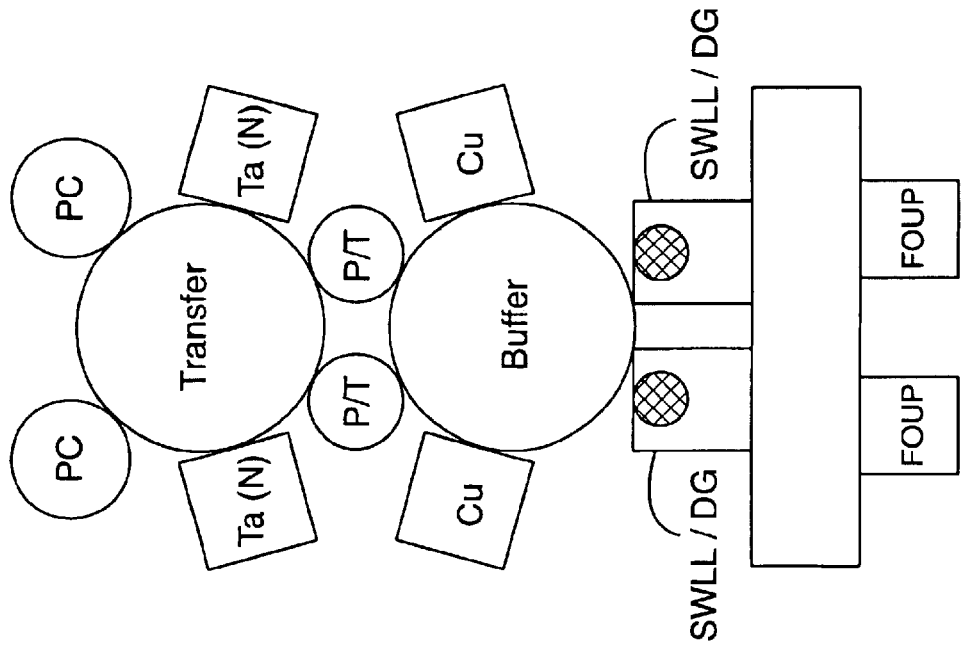
FIGS. 1A and 1B show conventional system architectures for Cu barrier and seed layer deposition. The abbreviations used herein are: FOUP—front opening unified pod: SWLL—single wafer loadlock chamber; DG—degas chamber; SWLL/DG—single wafer loadlock degas chamber; PC—preclean chamber; P/T—pass-through chamber; Ta(N)—Ta or TaN process chamber; Cu—Cu process chamber.
Figure 1A:
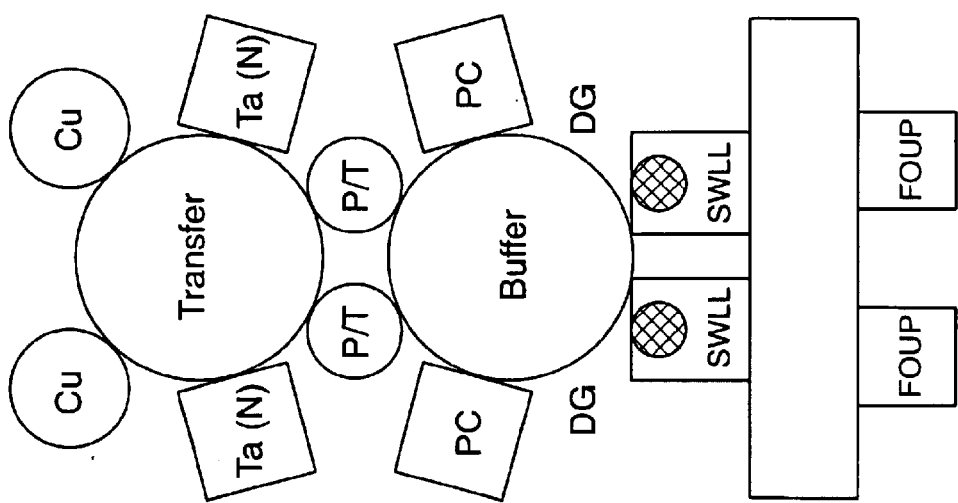

Examples of the conventional system architecture to deposit Cu barrier and seed layers on semiconductor wafers are illustrated in FIGS. 1A and 1B. In these systems, typical wafer process sequences are:

FOUP→SWLL→DG→PC→P/T→Ta(N)→Cu→P/T→SWLL→FOUP (FIG. 1A); or

FOUP→SWLL/DG→P/T→PC→Ta(N)→P/T→Cu→→SWLL→FOUP (FIG. 1B).

In case of FIG. 1A, the buffer robot has 4 wafer swaps (SWLL, DG, PC, and P/T) and transfer robot has 3 swaps {P/T, Ta(N), and Cu} to complete the entire wafer processes through the system. So, if the system has buffer and transfer robots with the same swap time, the buffer robot will limit theoretical robot-limited system throughput. Reducing 1 swap of buffer robot can be done by performing degas process (DG) in single wafer loadlock (SWLL) chamber. FIG. 1B show the system architecture with integrated degas module in single wafer loadlock chamber. In this case, both buffer and transfer robots have 3 swaps each.

Table 1 shows robot-limited system throughput and maximum allowed chamber time per given throughput with changes in number of swaps and swap times. Since number of swaps is one less with FIG. 1B configuration compared with FIG. 1A case, theoretical robot-limited system throughput of FIG. 1B configuration is much higher.

TABLE 1

System Throughput and Chamber Time with Various Number of Swaps and Swap Times

|  |  | Wafer swap time (sec) 14 | 12 | 10 |
|---|---|---|---|---|
| Configuration FIG. 1A | # of Robots | 2 | 2 | 2 |
|  | # of Swaps (per robot) | 4 | 4 | 4 |
|  | Throughput (wph) | 64 | 75 | 90 |
|  | Chamber time (sec) | 98 | 84 | 70 |
| Configuration FIG. 1B | # of Robots | 2 | 2 | 2 |
|  | # of Swaps (per robot) | 3 | 3 | 3 |
|  | Throughput (wph) | 86 | 100 | 120 |
|  | Chamber time (sec) | 70 | 60 | 50 |

One potential problem with FIG. 1B configuration is that maximum allowed chamber time to maintain maximum system throughput may become too short to perform the process required. For example, it is achievable to maintain system throughput of 120 wph with the wafer swap time of 10 sec, if chamber time is less than 50 sec. However, sometimes it is very difficult to reduce overall chamber time. Single wafer loadlock degas (SWLL/DG) chamber is a potential throughput limiting factor which may need longer chamber time than maximum allowed chamber time. Since SWLL chamber deals with pumpdown/vent processes (typically≧25 sec), degas process time (typical≧30 sec.) will be very limited with SWLL/DG chamber configuration.

Another potential problem with FIG. 1B configuration is the case of employing a resistive heater style degas in SWLL/DG. Since SWLL/DG chamber needs to be vented to 1 atmospheric pressure to return fully processed wafer to the front opening unified pod, the wafer gets heat from the heated pedestal and the wafer temperature elevates while venting the chamber. In this case, when the door is open to transfer the wafer from SWLL/DG chamber to the front opening unified pod, oxygen entering into the chamber can easily form oxide on Cu film and may also cause particle generation by forming oxide on the heated pedestal. To prevent oxygen from entering the SWLL/DG chamber, a high flow of nitrogen or argon (>10 standard liters per minute) may be needed while the door is open to the atmosphere.

Figure 2:
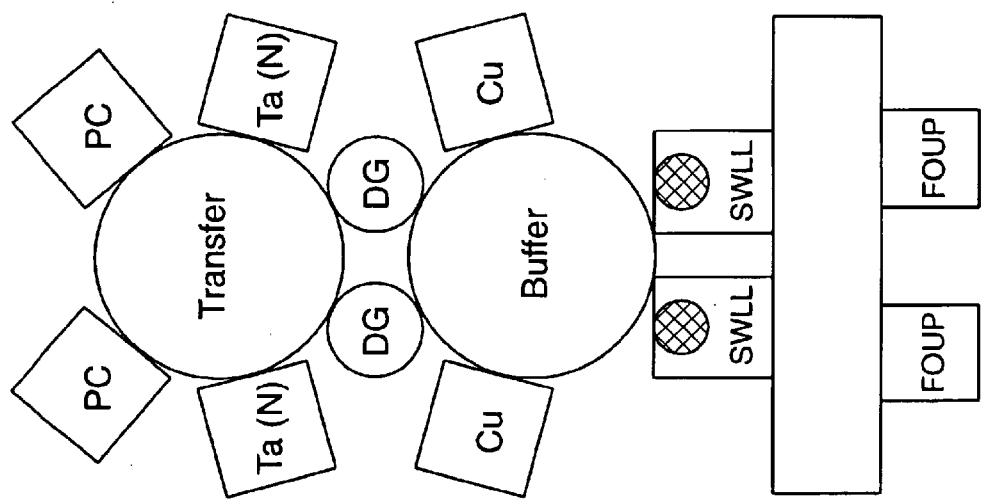
FIG. 2 shows system architecture of Cu barrier and seed layer deposition system in accordance with the present invention. The same abbreviations are used herein as those in FIGS. 1A and 1B.

Provided herein is a new system to solve the above-mentioned problems. In the new system, the wafer process sequence is:

FOUP→SWLL→DG→PC→Ta(N)→DG (as a P/T) →Cu→SWLL→FOUP (FIG. 2).

In one aspect, this new system provides a solution of simpler system architecture to maintain the same system throughput without sacrificing degas process time by integrating degas module to the conventional pass-through (P/T) chamber position. Both robots still maintain 3 swaps each, i.e., the buffer robot has SWLL, Cu, DG; while the transfer robot has DG, PC, Ta(N). With such configuration, new degas chamber has a fully dedicated chamber time for degas process. The new system architecture easily enables system to achieve ultra high system throughput of >100 wph. In addition to system configurations for Cu barrier and seed layer deposition, this new configuration may be beneficial for some other applications (mostly 3 swap cases) as well.

In another aspect, this new system provides a cost reduction compared to the cost of the conventional systems shown in FIGS. 1A and 1B. By replacing dedicated pass-through chambers with degas chambers, cost will be greatly reducer for materials, system building, and system maintenance.

The new degas chamber of the presently disclosed new system may use the designs which are well-known in the state of the art, such as IR lamps degas (orienter/degas chamber of 200 mm Endura CL), resistively heated pedestal degas degas chamber of 300 mm Endura CL), IR lamps degas with cooldown pedestal (SWLL/degas chambers of 200 mm/300 mm Endura SL), or resistively heated pedestal degas with integrated cooldown station (anneal chamber of 200 mm/300 mm ECP).

In conclusion, provided herein is a system architecture of semiconductor manufacturing equipment, wherein degas chamber(s) are integrated to the conventional pass-through chamber location. Specifically, the system has 3 swaps each for buffer robot and transfer robot.

Also provided herein is a system for depositing Cu barrier and seed layers on a semiconductor wafer. This system comprises a front opening unified pod(s) to carry pre- or post-processed wafers, a single wafer loadlock chamber(s), a degas chamber(s), a preclean chamber(s), a Ta or TaN process chamber(s), and a Cu process chamber(s). The degas chamber is integrated to a pass-through chamber. That is, the pass-through chamber in conventional designs is replaced by the degas chamber. Examples of degas chamber include IR lamps degas chamber, resistively heated pedestal degas chamber, IR lamps degas chamber with cool-down pedestal, or resistively heated pedestal degas chamber with integrated cool-down station.

Still provided herein is a method of depositing Cu barrier and seed layers on a semiconductor wafer using the above-described system. This method comprises the steps of (1) loading the wafer to the degas chamber from the front opening unified pod through the single wafer loadlock chamber; (2) performing degas processing on the wafer in the degas chamber; (3) removing (etching) native oxide from the wafer surface in the preclean chamber; (4) depositing Ta or TaN (as a Cu barrier layer) on the wafer in the Ta or TaN process chamber; (5) passing the processed wafer through the degas chamber; (6) depositing Cu seed layer on the wafer in the Cu process chamber; and (7) transferring the processed wafer from the Cu process chamber to the front opening unified pod through the single wafer loadlock chamber, thereby obtaining a wafer with Cu barrier and seed layer deposition. This method provides ultra high system throughput of more than 100 wafers per hour.

Any patents or publications mentioned in this specification are indicative of the levels of those skilled in the art to which the invention pertains. These patents and publications are herein incorporated by reference to the same extent as if each individual publication was specifically and individually indicated to be incorporated by reference.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A method of manufacturing a semiconductor circuit on a substrate, comprising the steps of:

providing first and second substrate handling robots;

coupling a first process chamber to the first robot so that the first robot can transfer a substrate into and out of the first process chamber, wherein the first process chamber is a deposition chamber or a plasma chamber, and wherein the first process chamber is not coupled to the second robot;

coupling a second process chamber to the second robot so that the second robot can transfer a substrate into and out of the second process chamber, wherein the second process chamber is a deposition chamber or a plasma chamber, and wherein the second process chamber is not coupled to the first robot;

coupling one or more pass-through chambers to both the first robot and the second robot so that both the first robot and the second robot can transfer a substrate into and out of each of the pass-through chambers, wherein said one or more pass-through chambers include a first pass-through chamber; and subsequently performing the sequential steps of:

the first robot transferring a first substrate into the first pass-through chamber;

heating said first substrate within the first pass-through chamber; and the second robot removing said first substrate from the first pass-through chamber.

2. A method according to claim 1, further comprising the subsequent step of:

the second robot transferring said first substrate to the second process chamber.

3. A method according to claim 2, further comprising the subsequent sequential steps of:

the second robot removing said first substrate from the second process chamber;

the second robot transferring said first substrate into one of the pass-through chamb the first robot removing said first substrate from said one pass-through chamber; an the first robot transferring said first substrate to the first process chamber.

4. A method according to claim 3, wherein said one pass-through chamber is the first pass-through chamber.

5. A method according to claim 3, further comprising the steps of:

after the step of the second robot transferring said first substrate to the second process chamber, depositing tantalum or tantalum nitride on the substrate within the second process chamber; and after the step of the first robot transferring said first substrate to the first process chamber, depositing copper on the substrate within the first process chamber.

6. A method according to claim 3, further comprising the steps of:

after the step of the second robot transferring said first substrate to the second process chamber, removing native oxide from the surface of the substrate within the second process chamber; and after the step of the first robot transferring said first substrate to the first process chamber, depositing copper on the substrate within the first process chamber.

7. A method according to claim 6, further comprising the steps of:

coupling a third process chamber to the second robot so that the second robot can transfer a substrate into and out of the third process chamber, wherein the third process chamber is not coupled to the first robot;

after the step of removing native oxide and before the step of the second robot transferring the first substrate into one of the pass-through chambers, performing the sequential steps of:

the second robot removing the first substrate from the second process chamber;

the second robot transferring the first substrate into the third process chamber; and within the third process chamber, depositing tantalum or tantalum nitride on the first substrate.

8. A method according to claim 2, further comprising the steps of:

coupling a loadlock chamber to the first robot so that the first robot can transfer a substrate into and out of the loadlock chamber, wherein the loadlock chamber is not coupled to the second robot, and wherein the loadlock chamber is not coupled to any of said one or more pass-through chambers; and after the step of the second robot transferring said first substrate to the second process chamber, the subsequent steps of:

the second robot transferring said first substrate into one of the pass-through chambers;

the first robot removing said first substrate from said one pass-through chamber; and the first robot transferring said first substrate into the loadlock chamber.

9. A method according to claim 1, further comprising the steps of:

coupling a loadlock chamber to one of said first and second robots so that said one robot can transfer a substrate into and out of the loadlock chamber, wherein the loadlock chamber is not coupled to the other one of said first and second robots, and wherein the loadlock chamber is not coupled to any of said one or more pass-through chambers; and before the step of the first robot transferring said first substrate into the first pass-through chamber, said one robot removing said first substrate from the loadlock chamber.

10. A method according to claim 1, further comprising the steps of:

coupling a loadlock chamber to one of said first and second robots so that said one robot can transfer a substrate into and out of the loadlock chamber, wherein the loadlock chamber is not coupled to the other one of said first and second robots, and wherein the loadlock chamber is not coupled to any of said one or more pass-through chambers; and after the step of the second robot removing said first substrate from the first pass-through chamber, said one robot transferring said first substrate into the loadlock chamber.

11. A method according to claim 1, further comprising the steps of:

coupling a loadlock chamber to the first robot so that the first robot can transfer a substrate into and out of the loadlock chamber, wherein the loadlock chamber is not coupled to the second robot, and wherein the loadlock chamber is not coupled to any of said one or more pass-through chambers; and before the step of the first robot transferring said first substrate into the first pass-through chamber, the first robot removing said first substrate from the loadlock chamber.

12. A method according to claim 1, further comprising the step of:

providing a resistive heater within the pass-through chamber;

wherein the heating step comprises the step of said resistive heater heating said first substrate within the pass-through chamber.

13. A method according to claim 1, wherein the heating step comprises the step of:

directing infrared radiation so as to heat said first substrate within the pass-through chamber.

14. A method of depositing a copper layer on a substrate, comprising the steps of:
providing first and second substrate handling robots;
coupling a first process chamber to the first robot so that the first robot can transfer a substrate into and out of the first process chamber, wherein the first process chamber is a deposition chamber or a plasma chamber, and wherein the first process chamber is not coupled to the second robot;
coupling a second process chamber to the second robot so that the second robot can transfer a substrate into and out of the second process chamber, wherein the second process chamber is a deposition chamber or a plasma chamber, and wherein the second process chamber is not coupled to the first robot;
coupling one or more pass-through chambers to both the first robot and the second robot so that both the first robot and the second robot can transfer a substrate into and out of each of the pass-through chambers, wherein said one or more pass-through chambers include a first pass-through chamber; and
subsequently performing the sequential steps of:
the first robot transferring a first substrate into the first pass-through chamber;
heating said first substrate within the first pass-through chamber;
the second robot removing said first substrate from the first pass-through chamber;
the second robot transferring said first substrate to the second process chamber;
within the second process chamber, depositing tantalum or tantalum nitride on the substrate;
the second robot transferring said first substrate into one of the pass-through chambers;
the first robot removing said first substrate from said one pass-through chamber;
the first robot transferring said first substrate into the first process chamber; and
within the first process chamber, depositing copper on the substrate.

15. A method of depositing a copper layer on a substrate, comprising the steps of:
providing first and second substrate handling robots;
coupling a first process chamber to the first robot so that the first robot can transfer a substrate into and out of the first process chamber, wherein the first process chamber is a deposition chamber or a plasma chamber, and wherein the first process chamber is not coupled to the second robot;
coupling a second process chamber to the second robot so that the second robot can transfer a substrate into and out of the second process chamber, wherein the second process chamber is a deposition chamber or a plasma chamber, and wherein the second process chamber is not coupled to the first robot;
coupling one or more pass-through chambers to both the first robot and the second robot so that both the first robot and the second robot can transfer a substrate into and out of each of the pass-through chambers, wherein said one or more pass-through chambers include a first pass-through chamber; and
subsequently performing the sequential steps of:
the first robot transferring a first substrate into the first pass-through chamber;
heating said first substrate within the first pass-through chamber;
the second robot removing said first substrate from the first pass-through chamber;
the second robot transferring said first substrate to the second process chamber;
within the second process chamber, removing native oxide from the surface of the substrate;
the second robot transferring said first substrate into one of the pass-through chambers;
the first robot removing said first substrate from said one pass-through chamber;
the first robot transferring said first substrate into the first process chamber; and
within the first process chamber, depositing copper on the substrate.

16. A method according to claim 15, further comprising the steps of:
coupling a third process chamber to the second robot so that the second robot can transfer a substrate into and out of the third process chamber, wherein the third process chamber is not coupled to the first robot; and
after the step of removing native oxide and before the step of the second robot transferring the first substrate into one of the pass-through chambers, performing the sequential steps of:
the second robot removing the first substrate from the second process chamber;
the second robot transferring the first substrate into the third process chamber; and
within the third process chamber, depositing tantalum or tantalum nitride on the first substrate.

* * * * *